United States Patent [19]

Shimazaki et al.

[11] Patent Number: 5,058,176
[45] Date of Patent: Oct. 15, 1991

[54] IMAGE DIAGNOSIS APPARATUS

[75] Inventors: Toru Shimazaki; Keiki Yamaguchi; Yoshihiko Watanabe; Noriaki Yamada, all of Tokyo, Japan

[73] Assignee: Yokogawa Medical Systems, Limited, Tokyo, Japan

[21] Appl. No.: 295,038

[22] PCT Filed: Jul. 2, 1987

[86] PCT No.: PCT/JP87/00462
§ 371 Date: Dec. 28, 1988
§ 102(e) Date: Dec. 28, 1988

[87] PCT Pub. No.: WO88/00026
PCT Pub. Date: Jan. 14, 1988

[30] Foreign Application Priority Data

Jul. 2, 1986 [JP] Japan .................. 61-155853

[51] Int. Cl.$^5$ .................. G06K 9/00; H05G 1/64; G06F 15/00; H04N 5/32
[52] U.S. Cl. .................. 382/6; 382/50; 358/111; 364/413.13; 378/99
[58] Field of Search .................. 382/6, 50; 364/413.14, 364/413.13; 358/111; 378/99

[56] References Cited

U.S. PATENT DOCUMENTS

| | | | |
|---|---|---|---|
| 4,688,175 | 8/1987 | Kaneko et al. | 364/413.13 |
| 4,852,002 | 7/1989 | Klausz | 364/413.13 |
| 4,864,500 | 9/1989 | Ichihara | 364/413.13 |

FOREIGN PATENT DOCUMENTS 54-162931 12/1979 Japan .

Primary Examiner—Leo H. Boudreau
Assistant Examiner—Steven P. Fallon
Attorney, Agent, or Firm—Moonray Kojima

[57] ABSTRACT

The image diagnosis apparatus of the present invention is equipped with means for automatically determining a window level and a window width for image displaying in accordance with the value of reconstructed image data. With this window level/window width calculating means (13), the window level is obtained with respect to each reconstructed image on the basis of the virtual average value of its pixel data and the window width is also obtained which has a certain relationship with that window level. When displaying each reconstructed image, a display is made in accordance with each window level and each window width thus obtained. Instead of the obtained window level and window width, those set by a manual setting section (23) may be used by a changeover operation when necessary.

23 Claims, 5 Drawing Sheets

Fig. 5
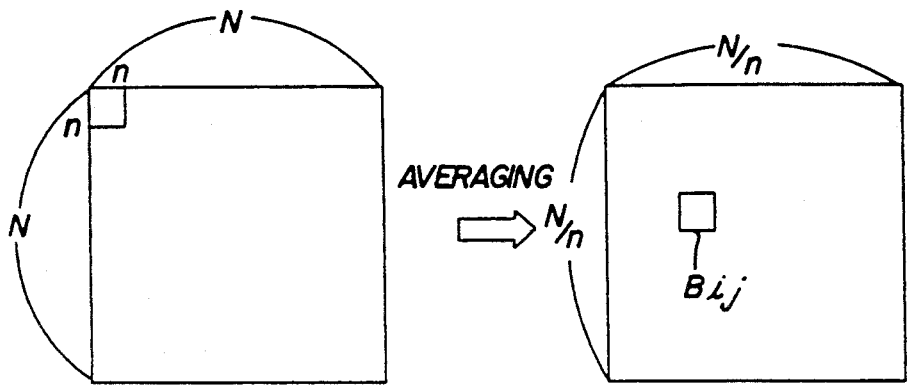
Fig. 6
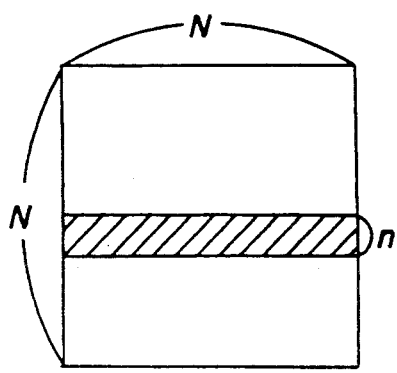
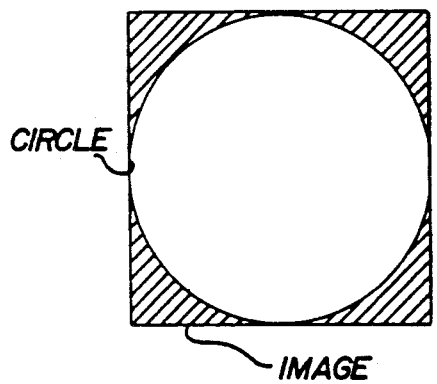
Fig. 7

IMAGE DIAGNOSIS APPARATUS

TECHNICAL FIELD

This invention relates to an improvement of an image diagnosis apparatus and more particularly, to an image diagnosis apparatus which is equipped with means for automatically determining in accordance with the value of image data a window level and a window width for image displaying.

BACKGROUND ART

The image diagnosis apparatus, such as NMR imaging apparatus and X-ray CT apparatus, fundamentally comprises data collecting means for collecting projection data pertaining to a desired section of a subject to be examined by the use of the nuclear magnetic resonance phenomena or X ray, image reconstructing means for reconstructing the sectional image of the subject on the basis of the collected projection data, and image display means for displaying the reconstructed image.

FIG. 9 shows an NMR imaging apparatus which is an example of the foregoing type of image diagnosis apparatus. The NMR imaging apparatus has a magnet section which is configured so that a static magnetic field coil 1 and a gradient magnetic field coil 2 (made up of coils for the individual x-, y- and z-axes) are disposed in place. The static magnetic field coil 1 is energized by a static magnetic field coil driving section 3 with the gradient magnetic field coil 2 by a gradient magnetic field coil driving section 4, so that in the inside space of the magnet there are created a static magnetic field being uniform in the z-axis direction and gradient magnetic fields oriented in the same direction as that of the static magnetic field but each having a linear gradient in each direction of the x-, y- and z-axes. An exciting coil 5 and a detecting coil 6 are disposed in the magnetic field of the magnet section while keeping a rotational angle of 90° therebetween about the z-axis, the former coil being energized by an exciting coil driving section 7 to apply high-frequency electromagnetic wave pulses to a subject (not shown) placed in the inside space of the magnet with the latter coil detecting an NMR signal coming from a desired spot of the subject and applying it to an analog-to-digital converting section (hereinafter referred to as A-D converting section) 8. This A-D converting section 8 converts the detection signal into a digital signal and applies it to a control/image processing section 9. This control/image processing section 9 is the center of control and image processing over the whole NMR imaging apparatus and is made of a computer. The control/image processing section 9 is equipped with an external memory 10. The control/image processing section 9 controls the static magnetic field coil driving section 3, gradient magnetic field coil driving section 4, exciting coil driving section 7 and A-D converting section 8 to collect the NMR signal of the subject, and stores the obtained NMR signal (raw data) in the external memory 10. Further, the control/image processing section 9 reconstructs an image representative of a subject's section on the basis of the raw data stored in the external memory 10 and stores the reconstructed image in the external memory 10 again. Further, the control/image processing section 9, in accordance with an instruction from an operator which is given through an operator console 15, reads out the reconstructed image from the external memory 10 and applies it through a display control section 11 to a display unit 14 where it is displayed. At this stage, a window level and a window width for image displaying are regulated for the purpose of making the brightness and gradation of the displayed image adequate.

In the NMR imaging apparatus, the value of the pixal data forming the reconstructed image and its range of variation, i.e. the brightness and gradation of the reconstructed image, vary depending on the system of data collection (pulse sequence), and further, where imaging is carried out using the multiecho method, since the intensity of each of a plurality of echo signals measured in succession becomes progressively weak, the brightness and gradation of each reconstructed image based on each echo vary. To display several reconstructed images differing in brightness and gradation in easily-observable form, it is necessary to regulate each window level and window width adequately so that each image can be displayed with uniform brightness and gradation. Further, also in other types of image diagnosis apparatus such as X-ray CT apparatus, where the brightness and gradation vary from one reconstructed image to another, the window level and window width must be regulated similarly. Hitherto, such a regulation operation for the window level and window width was very complicated because it was performed by an operator with respect to each reconstructed image.

DISCLOSURE OF THE INVENTION

It is the object of the present invention to provide an image diagnosis apparatus equipped with means for automatically determining in accordance with the value of reconstructed image data a window level and a window width for image displaying.

The present invention is characterized in that a window level/window width calculating means (13) obtains, with respect to each reconstructed image, a window level on the basis of the virtual average value of the pixel data of each image and as a window width, a value having a certain relationship with the value of the window level, and when displaying each reconstructed image, a display is made in accordance with the thus obtained window level and window width. Instead of the foregoing values, those being set by a manual setting section (23) may be used as the window level and window width by a changeover operation when necessary.

BRIEF DESCRIPTION OF THE DRAWINGS

FIGS. 2, 3, 5, 6 and 7 are schematic diagrams of the matrix of two-dimensional image data pertaining to a reconstructed image.

BEST MODE FOR CARRYING OUT THE INVENTION

Figure 1:
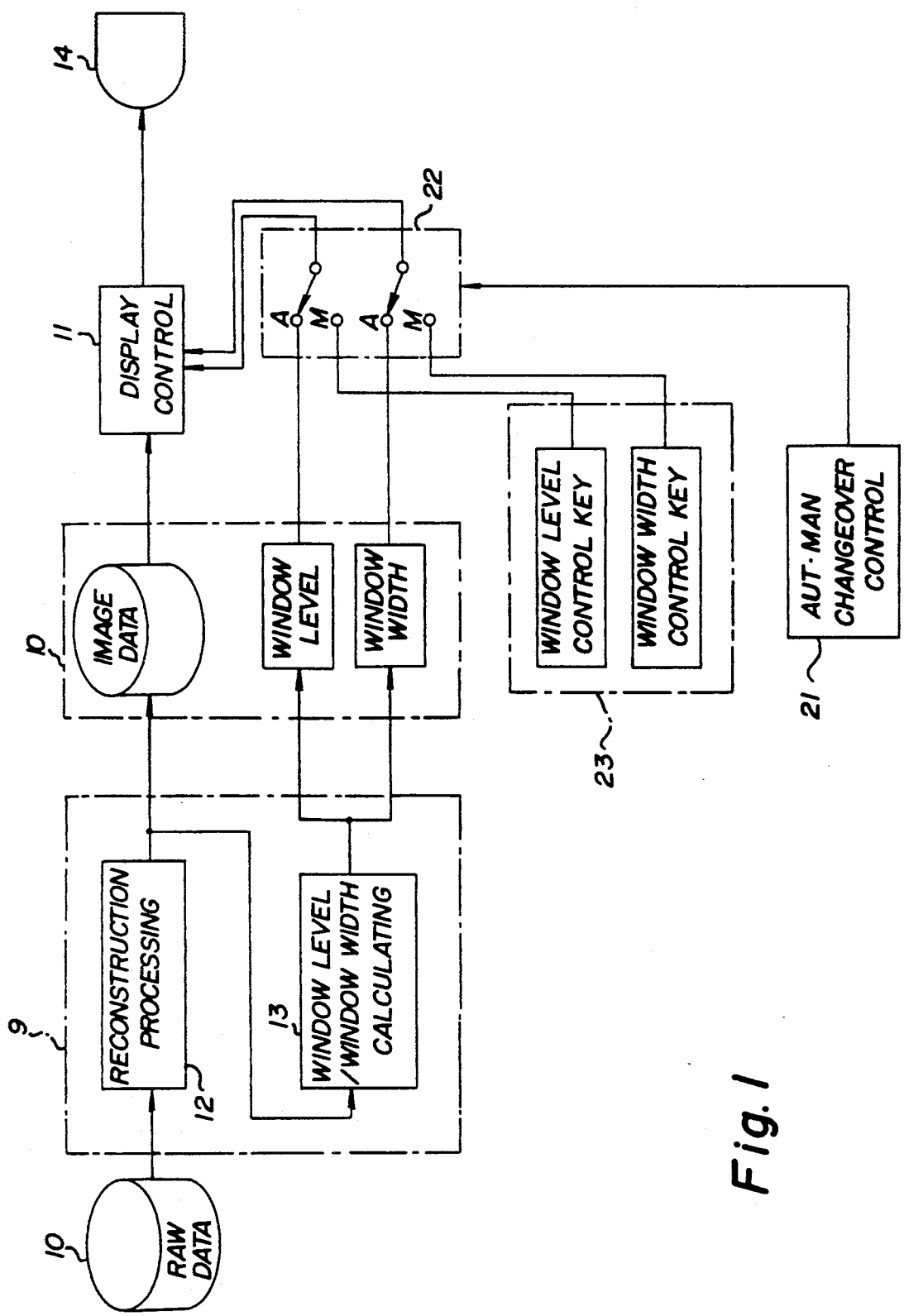
FIG. 1 is a schematic block diagram showing an embodiment of the present invention.
Figure 9:
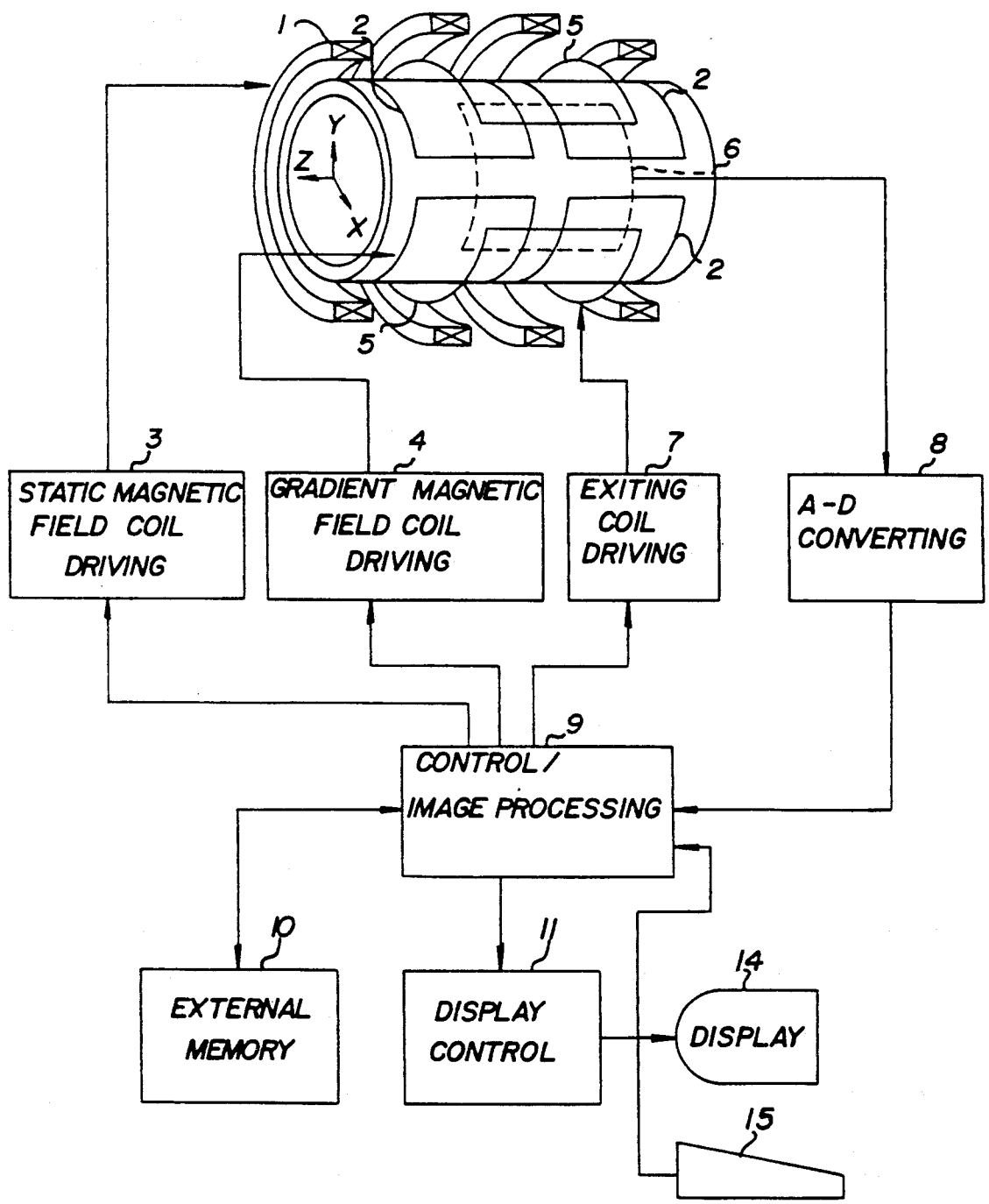
FIG. 9 is a schematic block diagram of an NMR imaging apparatus.

FIG. 1 is a schematic block diagram of an embodiment of the present invention, depicted paying attention to the processing of image data. In FIG. 1, components identical with those of FIG. 9 are designated by the same reference numerals. The external memory 10 holds raw data pertaining to a subject which has been collected by the NMR imaging apparatus, X-ray CT apparatus, etc. in accordance with the well-known method. The control/image processing section 9 includes a reconstruction processing section 12 and a window level/window width calculating section (hereinafter referred to as W/L calculating section) 13. Among them, the reconstruction processing section 12 processes the raw data stored in the external memory 10 through the known image reconstruction technique such as the two-dimensional inverse Fourier transformation and stores the reconstructed image in an image data area of the same external memory 10. The image data thus stored in the external memory 10 is read out by the display control section 11 and displayed on the display unit 14. The W/L calculating section 13 obtains, through techniques hereinafter described in greater detail and with respect to each reconstructed image, a window level and a window width used in displaying each image and stores them in the external memory 10 in paired form with the image data of the corresponding reconstructed image. The window level and window width can be set manually by a manual setting section 23, other than being obtained by the W/L calculating section 13. Either the window level and window width stored in the external mamory 10 or those set by the manual setting section 23 are selected by a changeover switch 22 to be applied to the display control section 11. The changeover switch 22 is turned by controlling an AUT/MAN changeover control section 21. When the display control section 11 is to read out the image data of the external memory 10 and display it on the display unit 14 in the form of an image, a display is made with a window level and a window width which are determined by a window level designating value and a window width designating value given through the changeover switch 22.

Figure 2:
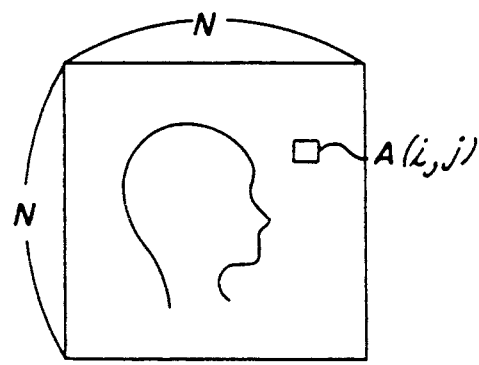

Calculation of the window level and window width is carried out by the W/L calculating section 13 as follows. Let the image data, i.e. the two-dimensional image data, pertaining to some reconstructed image be given in the form of pixel data $A(i,j)$ of $N \times N$ matrix as shown in FIG. 2, then, the W/L calculating section 13 obtains the window level $L_1$ for image displaying using the pixel data $A(i,j)$ in accordance with the following expression (1):

$$L_1 = \left\{ \sum_{i=1}^{N} \sum_{j=1}^{N} A(i,j) \right\} / N^2 \qquad (1)$$

This expression (1) means that the average value of the pixel data of the reconstructed image is used as the window level. After the window level $L_1$ is obtained in the foregoing manner, the W/L calculating section 13 obtains the window width $W_1$ using the calculated value $L_1$ of the window level in accordance with the following expression (2):

$$W_1 = L_1 \text{ to } 3L_1 \qquad (2)$$

That is, the window level $L_1$ obtained is the average value of all pixel data, and the window width $W_1$ obtained is 1 to 3 times the value $L_1$ of the window level. A magnification ratio, 1 to 3, for determination of the window width $W_1$ is determined depending on the type of an object spot of the subject. These window level $L_1$ and window width $W_1$ are annexed to the two-dimensional image data pertaining to the reconstructed image as part of file information and stored in the external memory 10. Then, when making an image display with the changeover switch 22 turned to the AUT side, the two-dimensional image data and the window level $L_1$ and window width $W_1$ annexed to that data are read out and applied to the display control section 11, so that a display is made with the intermediate value of the brightness of the display image, i.e. the window level, being set to the average value of the pixels and with the difference between the white level and the black level, i.e. the window width, being set to 1 to 3 times the average value of the pixel data. Accordingly, irrespective of what range the value of the pixel data of the reconstructed image falls within, its average value is always taken as the window level and this average value multiplied by a certain factor as the window width to display an image, so that any image can be displayed with uniform brightness and gradation. Where the changeover switch 22 has been turned to the MAN side, similarly to the prior art, an image display is made on the basis of a desired window level and a desired window width corresponding to the setting values of the manual setting section 23.

Figure 3:
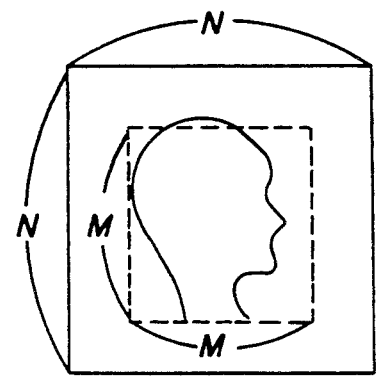

Determination of the window level and window width done by the W/L calculating section 13 can be carried out in accordance with, other than the foregoing expressions (1) and (2), several manners as follows. That is, (a) As shown in FIG. 3, the average value of the $M \times M$ pixels located inside a limited central area out of the matrix of the two-dimensional image data is taken as the window level $L_2$, and 1 to 3 times the window level $L_2$ is taken as the window width $W_2$.

Figure 4:
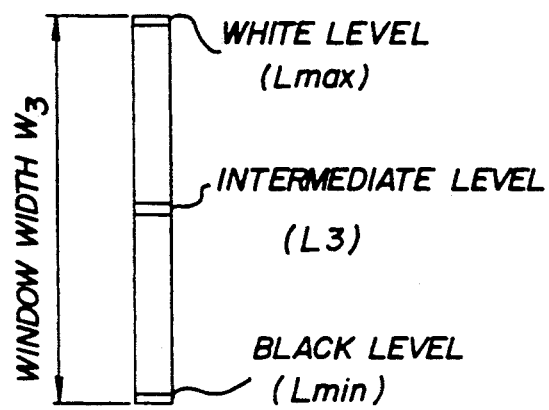
FIG. 4 is a diagram showing an example of the relationship between window level and window width.

(b) As shown in FIG. 4, 0.5 to 1 times the difference between the maximum value $L_{max} = A_{ij(max)}$ and the minimum value $L_{min} = A_{ij(min)}$ of all pixel data of the two-dimensional image data is taken as the window width $W_3$, and the intermediate value of them is taken as the window level $L_3$.

(c) As shown in FIG. 5, 0.5 to 1 times the difference between the maximum value $L_{max} = B_{ij(max)}$ and the minimum value $L_{min} = B_{ij(min)}$ out of the individual average values of the pixel data of sub-areas, $n \times n$, of the matrix of the two-dimensional image data is taken as the window width $W_4$, and the intermediate value of them is taken as the window level $L_4$.

(d) As shown in FIG. 6, 0.5 to 1 times the difference between the maximum value and the minimum value of the pixel data of a specified vertical or horizontal band-like area in the matrix of the two-dimensional image data is taken as the window width $W_5$, and the intermediate value of them is taken as the window level $L_5$.

(e) As shown in FIG. 7, the average value of the inside pixel data of the inscribed circle of the matrix of the two-dimensional image data is taken as the window level $L_6$, and 2 times the difference between that average value and the average value of the outside pixel data of the same is taken as the window width $W_6$.

Figure 8:
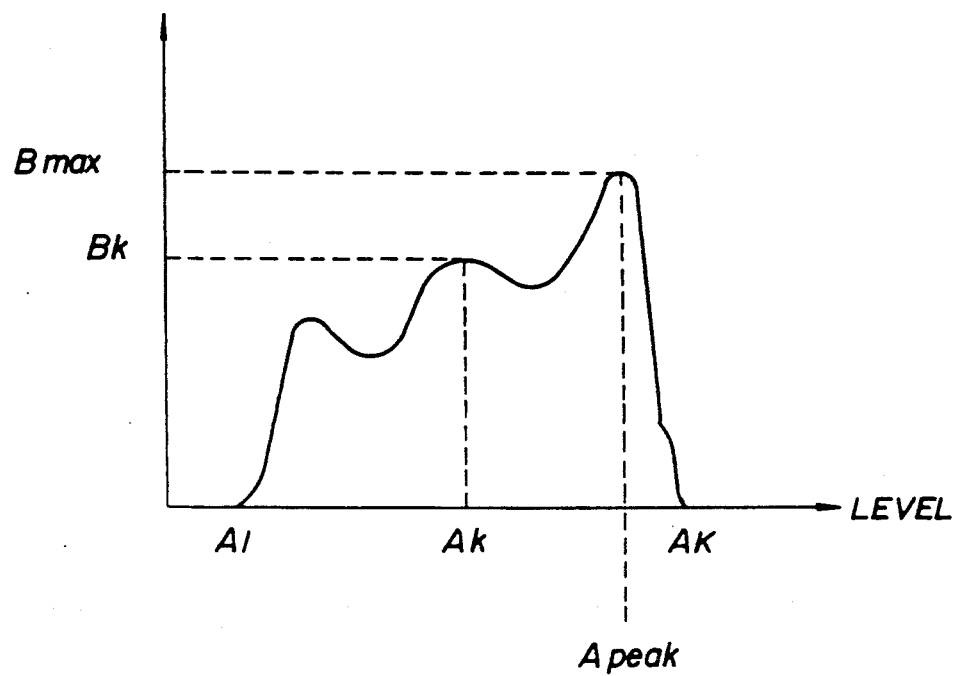
FIG. 8 is a graph showing an example of the histogram of image data pertaining to a reconstructed image.

(f) As shown in FIG. 8, the center of gravity of the histogram of all pixel data of the two-dimensional image data, which is calculated in accordance with the following expression (3):

$$L_7 = \left( \sum_{k=1}^{k} A_k \cdot B_k \right) / N^2 \qquad (3)$$

, is taken as the window level $L_7$, and 1 to 3 times the $L_7$ is taken as the window width $W_7$.

(g) One out of the foregoing window levels $L_1$ through $L_7$ and one out of the foregoing window widths $W_1$ through $W_7$ are selected to provide a combination of them that differs from the foregoing.

It should be noted that the switching between AUT and MAN done by the changeover switch 22 may be made independently between the window level and the window width. In this case, the calculated value held in the external memory 10 of either the window level or the window width is used as the one, and some value manually set in the manual setting section is used as the other.

Although the best mode for embodying the present invention has been described, it is easy for those skilled in the art to make various changes without departing from the scope of the appended claims.

What is claimed is:

1. In an image diagnosis apparatus comprising
   means for collecting data pertaining to tissue configuration or biochemical functions of a subject to be examined;
   means for converting said data into two-dimensional image data by reconstruction processing;
   means for storing said two-dimensional image data in a memory means;
   means for manually setting a window level and a window width; and
   means for generating an image based on said two-dimensional image data;
   the improvement comprising
   calculating means for calculating a window level and a window width peculiar to each two-dimensional image data in accordance with a predetermined calculation method;
   memory means for storing the values calculated by said calculating means in annexed form to each two dimensional image data; and
   switching means for selectively switching to said means for generating an image any of the following:
   (1) said set window level and said set window width,
   (2) said calculated window level and said calculated window width,
   (3) said set window level and said calculated window width, or
   (4) said calculated window level and said set window width.

2. In an image diagnosis apparatus comprising
   means for collecting data pertaining to tissue configuration or biochemical functions of a subject to be examined;
   means for converting said data into two-dimensional image data by reconstruction processing;
   means for storing said two-dimensional image data in a memory means;
   means for manually setting a window level and a window width; and
   means for generating an image based on said two-dimensional image data;
   the improvement comprising
   calculating means for calculating a window level and a window width peculiar to each two-dimensional image data in accordance with a predetermined calculation method;
   memory means for storing the values calculated by said calculating means in annexed form to each two dimensional image data; and
   switching means for selectively switching said set window level and said window width or said calculated window level and said calculated window width, or any combination thereof, to said means for generating an image;
   wherein said calculating means calculates a window level by taking the average value of all pixels of an image to be reconstructed, and calculates a window width by multiplying the calculated window level by a factor of 1 to 3.

3. In an image diagnosis apparatus comprising
   means for collecting data pertaining to tissue configuration or biochemical functions of a subject to be examined;
   means for converting said data into two-dimensional image data by reconstruction;
   means for storing said two-dimensional image data in a memory means;
   means for manually setting a window level and a window width; and
   means for generating an image based on said two-dimensional image data;
   the improvement comprising
   calculating means for calculating a window level and a window width peculiar to each two-dimensional image data in accordance with a predetermined calculation method;
   memory means for storing the values calculated by said calculating means in annexed form to each two dimensional image data; and
   switching means for selectively switching said set window level and said set window width or said calculated window level and said calculated window width, or any combination thereof, to said means for generating an image; wherein
   said calculating means calculates a window level by taking the average value of pixels in a limited central area of an image to be reconstructed, and calculates a window width by multiplying the calculated window level by a factor of 1 to 3.

4. In an image diagnosis apparatus comprising
   means for collecting data pertaining to tissue configuration or biochemical functions of a subject to be examined;
   means for converting said data into two-dimensional image data by reconstruction processing;
   means for storing said two-dimensional image data in a memory means;
   means for manually setting a window level and a window width; and
   means for generating an image based on said two-dimensional image data;
   the improvement comprising
   calculating means for calculating a window level and a window width peculiar to each two-dimensional image data in accordance with a predetermined calculation method;
   memory means for storing the values calculated by said calculating means in annexed form to each two-dimensional image data; and switching means for selectively switching said set window level and said set window width or said calculated window level and said calculated window width, or any combination thereof, to said means for generating an image; wherein said calculating means calculates a window level by taking an intermediate value between the maximum value and the minimum value of all pixels of an image to be reconstructed, and calculates a window width by multiplying the difference between the last mentioned said maximum and minimum values by a factor of 0.5 to 1.

5. In an image diagnosis apparatus comprising means for collecting data pertaining to tissue configuration or biochemical functions of a subject to be examined;

means for converting said data into two-dimensional image data by reconstruction processing;

means for storing said two-dimensional image data in a memory means;

means for manually setting a window level and a window width; and means for generating an image based on said two-dimensional image data;

the improvement comprising calculating means for calculating a window level and a window width peculiar to each two-dimensional image data in accordance with a predetermined calculation method;

memory means for storing the values calculated by said calculating means in annexed form to each two-dimensional image data; and switching means for selectively switching said set window level and said set window width or said calculated window level and said calculated window width, or any combination thereof, to said means for generating an image; wherein said calculating means calculates a window level by taking an intermediate value between the maximum value and the minimum value of individual average values of sub-areas defined on pixels of an image to be reconstructed, and calculates a window width by multiplying the difference between the last mentioned said maximum and minimum values by a factor of 0.5 to 1.

6. In an image diagnosis apparatus comprising means for collecting data pertaining to tissue configuration or biochemical functions of a subject to be examined;

means for converting said data into two-dimensional image data by reconstruction processing;

means for storing said two-dimensional image data in a memory means;

means for manually setting a window level and a window width; and means for generating an image based on said two-dimensional image data;

the improvement comprising calculating means for calculating a window level and a window width peculiar to each two-dimensional image data in accordance with a predetermined calculation method;

memory means for storing the values calculated by said calculating means in annexed form to each two-dimensional image data; and switching means for selectively switching said set window level and said set window width or said calculated window level and said calculated window width, or any combination thereof, to said means for generating an image; wherein said calculating means calculates a window level by taking an intermediate value between the maximum value and the minimum value of pixels located inside a limited vertical or horizontal band-like area of an image to be reconstructed, and calculates a window width by multiplying the difference between the last mentioned said maximum and minimum values by a factor of 0.5 to 1.

7. In an image diagnosis apparatus comprising means for collecting data pertaining to tissue configuration or biochemical functions of a subject to be examined;

means for converting said data into two-dimensional image data by reconstruction processing;

means for storing said two-dimensional image data in a memory means;

means for manually setting a window level and a window width; and means for generating an image based on said two-dimensional image data;

the improvement comprising calculating means for calculating a window level and a window width peculiar to each two-dimensional image data in accordance with a predetermined calculation method;

memory means for storing the values calculated by said calculating means in annexed form to each two-dimensional image data; and switching means for selectively switching said set window level and said set window width or said calculated window level and said calculated window width, or any combination thereof, to said means for generating an image; wherein said calculating means calculates a window level by taking the average value of pixels located inside an inscribed circle of an image to be reconstructed, and calculates a window width by multiplying the difference between said last mentioned average value and the average value of pixels located outside said inscribed circle by a factor of 2.

8. In an image diagnosis apparatus comprising means for collecting data pertaining to tissue configuration or biochemical functions of a subject to be examined;

means for converting said data into two-dimensional image data by reconstruction processing;

means for storing said two-dimensional image data in a memory means;

means for manually setting a window level and a window width; and means for generating an image based on said two-dimensional image data;

the improvement comprising calculating means for calculating a window level and a window width peculiar to each two-dimensional image data in accordnace with a predetermined calculation method;

memory means for storing the values calculated by said calculating means in annexed form in each two-dimensional image data; and switching means for selectively switching said set window level and said set window width or said calculated window level and said calculated window width, or any combination thereof, to said means for generating an image; wherein said calculating means calculates a window level by taking the center of gravity of a histogram of all pixels of an image to be reconstructed, and calculates a window width by multiplying said calculated window level by a factor of 1 to 3.

9. The apparatus of claim 2, 3, 4, 5, 6, 7 or 8, wherein said means for generating an image generates an image display based on a two-dimensional data using one of the calculated window levels, and a set window width.

10. The apparatus of claim 2, 3, 4, 5, 6, 7 or 8, wherein said means for generating an image generates an image display based on a two-dimensional data using one of the calculated window widths, and a set window level.

11. In an image diagnosis apparatus comprising
means for collecting data pertaining to tissue configurations or biochemical functions of a subject being examined;
means for storing two-dimensional image data in a memory means;
means for calculating window level and window width; and
means for generating an image based on said two-dimensional image data and using the calculated window level and window width;
the improvement wherein
said means for calculating calculates a window level by taking the average value of all pixels of a predetermined area of an image to be reconstructed, and calculates a window width by multiplying the calculated window level by a predetermined factor.

12. The apparatus of claim 11, wherein said calculating means calculates a window level by taking the average value of all pixels of an image to be reconstructed, and calculates a window width by multiplying the calculated window level by a factor of 1 to 3.

13. The apparatus of claim 11, wherein said calculating means calculates a window level by taking the average value of pixels in a limited central area of an image to be reconstructed, and calculates a window width by multiplying the calculated window level by a factor of 1 to 3.

14. The apparatus of claim 11, wherein said calculating means calculates a window level by taking an intermediate value between the maximum value and the minimum value of all pixels of the predetermined area of an image to be reconstructed, and calculates a window width by multiplying the difference between the last mentioned said maximum and minimum values by a factor of 0.5 to 1.

15. The apparatus of claim 11, wherein said calculating means calculates a window level by taking an intermediate value between the maximum value and the minimum value of individual average values of sub-areas defined on pixels of the predetermined area of an image to be reconstructed, and calculates a window width by multiplying the difference between the last mentioned said maximum and minimum values by a factor of 0.5 to 1.

16. The apparatus of claim 11, wherein said calculating means calculates a window level by taking an intermediate value between the maximum value and the minimum value of pixels located inside a limited vertical or horizontal band-like area of the predetermined area of an image to be reconstructed, and calculates a window width by multiplying the difference between the last mentioned said maximum and minimum values by a factor of 0.5 to 1.

17. The apparatus of claim 11, wherein said calculating means calculates a window level by taking the average value of pixels located inside an inscribed circle of an image to be reconstructed, and calculates a window width by multiplying the difference between said last mentioned average value and the average value of pixels located outside said inscribed circle by a factor of 2.

18. The apparatus of claim 11, wherein said calculating means calculates a window level by taking the center of gravity of a histogram of all pixels of the predetermined area of an image to be reconstructed, and calculates a window width by multiplying said calculated window level by a factor of 1 to 3.

19. The apparatus of claim 12, 13, 14, 15, 16, 17 or 18, wherein said means for generating an image generates an image display based on a two-dimensional data using one of the calculated window levels.

20. The apparatus of claim 12, 13, 14, 15, 16, 17 or 18, wherein said means for generating an image generates an image display based on a two-dimensional data using one of the calculated window widths.

21. In an image diagnosis apparatus comprising
means for collecting data pertaining to tissue configurations or biochemical functions of a subject to be examined;
means for storing two-dimensional image data in a memory means;
means for calculating window level and window width; and
means for generating an image based on said two-dimensional image data and using the calculated window level and window width;
the improvement wherein
said means for calculating calculates a window level by taking an intermediate value between the maximum value and the minimum value of all pixels of a predetermined area of an image to be reconstructed, and calculates a window width by multiplying the difference between the last mentioned said maximum and minimum values by a factor of 0.5 to 1.

22. The apparatus of claim 21, wherein said calculating means calculates a window level by taking an intermediate value between maximum and minimum values of individual average values of sub-areas defined on pixels of an image to be reconstructed.

23. The apparatus of claim 21, wherein said calculating means calculates a window level by taking the intermediate value between the maximum and minimum values of pixels located inside a limited vertical or horizontal band-like area of an image to be reconstructed.

* * * * *